United States Patent [19]
Gray et al.

[11] Patent Number: 5,218,174
[45] Date of Patent: Jun. 8, 1993

[54] LOW POWER CORDLESS MAGNETIC FIELD DIGITIZER WITH DIFFERENTIAL GRID SENSING AND SYNCHRONOUS POSITION DEMODULATION

[75] Inventors: Donald F. Gray, Phoenix; James L. Rodgers, Mesa; James R. Sciacero, Scottsdale; Charles A. Waterbury, Chandler, all of Ariz.

[73] Assignee: Kurta Corporation, Phoenix, Ariz.

[21] Appl. No.: 771,369

[22] Filed: Oct. 1, 1991

[51] Int. Cl.[5] .................................... G08C 21/00
[52] U.S. Cl. .......................................... 178/19; 178/18
[58] Field of Search ................................... 178/19, 18

[56] References Cited

U.S. PATENT DOCUMENTS

| | | | |
|---|---|---|---|
| 4,289,927 | 9/1981 | Rodgers | 174/19 |
| 4,661,656 | 4/1987 | Rodgers et al. | 178/18 |
| 4,672,154 | 6/1987 | Rodgers | 178/19 |
| 4,711,977 | 12/1987 | Miyamori et al. | 178/18 |
| 4,748,295 | 5/1988 | Rodgers | 178/19 |
| 4,786,765 | 11/1988 | Yamanami et al. | 178/19 |
| 4,848,496 | 7/1989 | Murakami et al. | 178/19 |
| 4,859,814 | 8/1989 | Sciacero et al. | 178/19 |
| 4,878,553 | 11/1989 | Yamanami et al. | 178/18 |
| 4,890,096 | 12/1989 | Taguchi et al. | 178/19 |
| 4,902,858 | 2/1990 | Yamanami et al. | 178/19 |
| 4,948,926 | 8/1990 | Murakami et al. | 178/19 |
| 4,956,526 | 9/1990 | Murakami et al. | 178/18 |
| 4,988,837 | 1/1991 | Murakami et al. | 178/18 |
| 4,990,726 | 2/1991 | Lasley | 178/19 |
| 4,999,461 | 3/1991 | Murakami et al. | 178/19 |

*Primary Examiner*—Stafford Schreyer
*Attorney, Agent, or Firm*—Cahill, Sutton & Thomas

[57] ABSTRACT

A digitizing system includes a tablet and a cordless pointing device including a plurality of data grid conductors in the tablet and a plurality of clock grid conductors in the tablet, all receiving a magnetic field signal transmitted by the pointing device. A data channel circuit includes a differential amplifier and demodulating and filtering circuitry coupled to an output of the differential amplifier, having a clock input. An A/D converter has an input coupled to an output of the demodulating and filtering circuitry. Multiplexing circuitry selectively couples various grid conductor signals to the data channel circuit. A clock recovery circuit responsive to the clock grid conductors includes a phase-locked-loop circuit that generates a recovered clock signal which is synchronous with the magnetic field signal and is used as a reference for demodulating the phase and amplitude of signals multiplexed from the data grid conductors to the data channel circuit. Accurate determination of the pointer tip position is achieved simultaneously with accurate decoding of pointer commands represented by shifts in the frequency of the magnetic field signal.

21 Claims, 5 Drawing Sheets

LOW POWER CORDLESS MAGNETIC FIELD DIGITIZER WITH DIFFERENTIAL GRID SENSING AND SYNCHRONOUS POSITION DEMODULATION

CROSS REFERENCE TO RELATED APPLICATIONS

This patent application is related to commonly assigned application entitled "POSITION RESOLVING SYSTEM", by Billy C. Fowler, Donald F. Gray, and James L. Rodgers, Ser. No. 769,447, filed on even date herewith, and incorporated herein by reference.

BACKGROUND OF THE INVENTION

Digitizing systems including cordless electric field, and also cordless magnetic field, coupled pointing device (including pens, cursors, mouses, etc.) are well known. Commonly assigned U.S. Pat. Nos. 4,859,814, 4,672,154, and 4,748,295, incorporated herein by reference, are generally indicative of the state of the art. Two types of digitizers, those with "electric field coupling" between the pointer and the digitizing grid and those with "magnetic field coupling" between the pointer and the digitizing grid have been widely used. It is known that such digitizing systems frequently must operate in environments with high electrical noise over a broad frequency spectrum. The major sources of such electrical noise are the fundamental and harmonic frequencies produced by a wide variety of common video monitors. In an office environment, computer monitors are the major source of electrical interference which would interfere with digitizing tablets, but there also are other noise sources, sources such as fluorescent lights and switching power supplies.

These noise sources all generate electric fields and electromagnetic fields that can interfere with the signal to be transmitted from the pointing device to the grid of a digitizer tablet. This is a particular problem in a cordless system. In general the spectrum of the fundamental frequencies of this interference is mostly under 100 KHz and the harmonics are mostly above KHz. In the frequency range from 300 KHz to 550 KHz most of the interference is harmonic in nature and subsequently the levels of interference are significantly less than at frequencies below 100 KHz. Operation in the frequency range from 300 KHz to 550 KHz is possible with a magnetic tablet or digitizer with the added benefit of increased transmission efficiency from the pointing device to the grid conductor due to the improved magnetic coupling at these higher frequencies. However, care must be taken in the design of the grid configuration to ensure that the self-resonance frequency of the grid is sufficiently above the operating frequency range so as to not to result in significant cross coupling between grid conductors so as to result in increased current flow that causes one line or loop to transmit a signal to other lines or loops. Major cross coupling of signals between grid conductors causes unpredictable errors in determining the pointing device position, and such errors are not amenable to usual correction techniques.

In contrast, operation of electric field coupled tablets or digitizers at frequencies much above 100 KHz is difficult or impractical due to the increased pointing device drive power required and the greater shunting effect that grid capacitance has on the "high source impedance" characteristic of an electric field induced grid signal.

Commonly assigned U.S. Pat. No. 4,859,814, entitled "NOISE CANCELLATION IN DIGITIZING SYSTEMS AND METHOD issued on Aug. 22, 1989, by Sciacero, et al. incorporated herein by reference, discloses use of a differential sensing technique in an electric field coupled system to cancel ambient noise.

It is generally accepted by those skilled in the art that digitizing systems based on magnetic field coupling between the pointing device and the digitizing grid are more "robust" than electric field coupling systems in the sense that they are less affected by the nearness of the user's hand, moisture, partial conductivity of materials put on the tablet surface such as certain inks or pencil leads, and conductive or dielectric effects of drawing instruments and other items in close proximity to the digitizing surface, and are generally more accurate and less affected by external environmental effects than electric field coupled digitizing systems.

In the past, magnetic field coupled tablets or digitizers have operated at carrier frequencies less than 100 KHz for several reasons. First, the grid configurations of prior magnetic field coupled tablets, especially those with repeating grid patterns, have had a low self-resonance frequency, and operation at any higher frequency results in uncorrectable positional errors. Second, the gain bandwidth product of the tablet carrier amplification/filtering stages of prior magnetic field coupled tablets has been limited due to the use of low frequency and low cost operational amplifier integrated circuits in these stages instead of discrete video type circuits. Third, the power consumed by the pointing devices of prior magnetic field coupled tablets has been less important because the pointing devices have been connected by a cable to the tablet, so the drive power could be as high as necessary to achieve an adequate induced grid signal-to-interference ratio.

In one prior art system, a cordless magnetic design utilizes a passive pointing device design. In this system a magnetic field is transmitted from the surface or grid and coupled into a high Q tuned circuit in the pointing device. The magnetic field then is turned off and the residual magnetic energy in the tuned circuit is received by the grid and used to resolve position of the pointing device until the residual energy is spent. This system has the advantage that the pointing device is essentially a passive device with minimum circuitry and without a need for additional power. However, this system requires periodic wait intervals when no detection of the pointing device signal is taking place and instead the "passive" pointing device is being "excited" by a magnetic signal being radiated from the tablet grid. This also means that the duty cycle of the received signal is greatly reduced, reducing the overall signal-to-noise ratio over time.

The above-described system also requires that the signal induced onto the grid by the pointing device be subjected to a two-way path loss. This two way loss generally leads to the requirement of more overall power for operation than the one-way loss to which the radiated signal of the present invention is subjected. While reducing circuitry in the pointing device, the foregoing technique requires added complexity to the grid structure since many lines or coils must be switched and driven with high power. This is particularly relevant in tablets used in portable or battery operated applications. Also, the foregoing approach requires that the grid be able to transmit as well as receive signals in order to operate. This requires that the grid conductors be of low resistance or impedance in order to obtain sufficient current and resulting magnetic field intensity to effectively transmit to the transducer coil. This leads to the requirement that the grid utilize low resistance wire or printed circuit elements in order to achieve sufficient power transmission. That prevents or limits the use of low cost and low-weight printed grids, such as those having silver ink printed on mylar film. The foregoing technique results in use of more power, generally lower proximity height for the pointing device, and reduced signal-to-noise ratio and increased susceptibility to noise, jitter, etc.

SUMMARY OF THE INVENTION

Accordingly, it is an object of the invention to provide a cordless magnetic field coupled digitizing system that provides highly accurate and reliable digitizing of the location of a pointing device while at the same time exhibiting high immunity to the noise produced by computers, monitors, switching power supplies, fluorescent lamps, etc. that is common in a digitizing environment.

It is another object of the invention to provide a magnetic field coupled cordless digitizing system that is capable of improved performance in operating with a wide range of pointing devices such as pens, cursors, pressure sensitive transducers, and devices with a high number of control switches, with automatic identification of such devices.

It is another object of the invention to provide a magnetic field coupled digitizing system that can operate with a pointing device located a substantial distance from the tablet surface.

It is another object of the invention to provide a magnetic field coupled digitizing system that requires only a very small amount of power to operate its pointing device.

It is another object of the invention to provide a digitizing system that can operate with sufficient bandwidth and speed to reproduce handwriting.

It is another object of the invention to provide a digitizing system with high immunity to noise generated by an LCD display or lamp noise such that the tablet and the display can be integrated into a single unit with the tablet grid directly in front of or behind the display.

It is another object of the invention to provide a digitizing system that allows a tablet grid implementation with either very low-cost printed silver or mylar conductors or very thin, nearly transparent indium-tin-oxide or equivalent conductors.

It is another object of the invention to provide improved operation with a cordless pointing device.

It is another object of this invention to provide improved operation and decoding of signals representing force applied on a pressure sensitive pen.

It is another object of the invention to provide a magnetically coupled digitizing system having a cordless pointing device with high accuracy despite appreciable "tilt" of the cordless pointing device.

It is another object of the invention to identify the pointing device to effectuate appropriate "s" curve correction for that pointing device.

Briefly described, and in accordance with one embodiment thereof, the invention provides a digitizing system including a cordless pointing device and tablet detection grid and electronics including a plurality of pairs of position resolving conductors each of which forms one or more differential coil elements in the tablet, each receiving a magnetic signal transmitted by the pointing device. First, second, third, and fourth carrier recovery conductors in the tablet also receive the magnetic signal. Position resolving circuitry includes a differential amplifier, multiplexing circuitry selectively coupling various pairs of the position resolving conductors to a pair of inputs of the differential amplifier, and synchronous demodulating circuitry coupled to an output of the differential amplifier. The synchronous demodulating circuitry includes a first input responsive to selected signals induced onto the differential coil elements and a second input responsive to a recovered pointing device carrier signal 51 to produce position resolving information. The system includes an analog-to-digital converter having an input coupled to an output of the synchronous demodulating circuitry to produce digital position resolving information. A computerized control system includes a plurality of inputs coupled to a plurality of outputs of the analog-to-digital converter. A plurality of outputs of the computerized control system are coupled to selection inputs of the multiplexing circuitry. The digitizing system includes carrier recovery circuitry including a first controllable gain differential amplifier having a pair of inputs coupled to the first and second carrier recovery conductors and a second controllable gain differential amplifier having a pair of inputs coupled to the third and fourth carrier recovery conductors. The carrier recovery circuitry also includes a first frequency doubler circuit having an input responsive to an output of the first controllable gain amplifier and a second frequency doubler circuit having an input responsive to an output of the second controllable gain amplifier. A signal combining circuit includes first and second inputs coupled to outputs of the first and second frequency doubler circuits, respectively. A threshold generating circuit includes an input coupled to the output of the signal combining circuit and an output coupled by an error amplifier circuit to gain control inputs of the first and second controllable gain amplifiers. A signal slicing, limiting circuit includes a first input coupled to an output of the signal combining circuit and a second input coupled to an output of the threshold generating circuit. A phase-locked-loop circuit includes an input coupled to the output of the comparator and produces a double frequency output signal that is deglitched and filtered. A divide-by-two circuit operates on the double frequency output signal from the phase-locked-loop circuit to produce the recovered pointing device carrier signal. The computerized control system measures the frequency of the magnetic signal and decodes the frequency of the magnetic signal, and at the same time resolves the position of the pointing device in response to the digital output of the analog-to-digital converter. The computer uses the decoded frequency information to determine status of switches of the pointing device, the type of the pointing device, and/or a value associated with a transducer output signal.

In the described embodiment, the magnetic signal has a frequency in the range of approximately 300 to 550 kilohertz. The multiplexing circuitry includes a first section having a first group of inputs coupled to a first group of the position resolving conductors, and a second section having a second group of inputs coupled to a second group of the position resolving conductors.

In the described embodiment, the pointing device includes a self-resonant, current switched LC oscillator including an inductor and a capacitive element coupled to form a self-resonant tank circuit, wherein the inductor radiates a magnetic signal to the tablet. The oscillator includes a current source supplying a measured amount of current, and a current switching circuit coupled to the current source and the tank circuit to alternately switch the measured amount of current into different sections of the tank circuit, wherein the inductor radiates maximum power at the self-resonant frequency of the oscillator regardless of the capacitance of the capacitive element, and wherein the power level of the magnetic signal transmitted from the inductor is substantially independent of the voltage of a power source energizing the pointing device. A plurality of frequency shifting capacitors are coupled across the tank by a plurality of manual switches to selectively shift the oscillation frequency. Alternatively, the capacitance of a voltage variable capacitive device coupled across the inductor is varied in response to a transducer to continuously shift the oscillation frequency in response to a signal produced by the transducer.

DETAILED DESCRIPTION OF THE PREFERRED EMBODIMENTS

Figure 1:
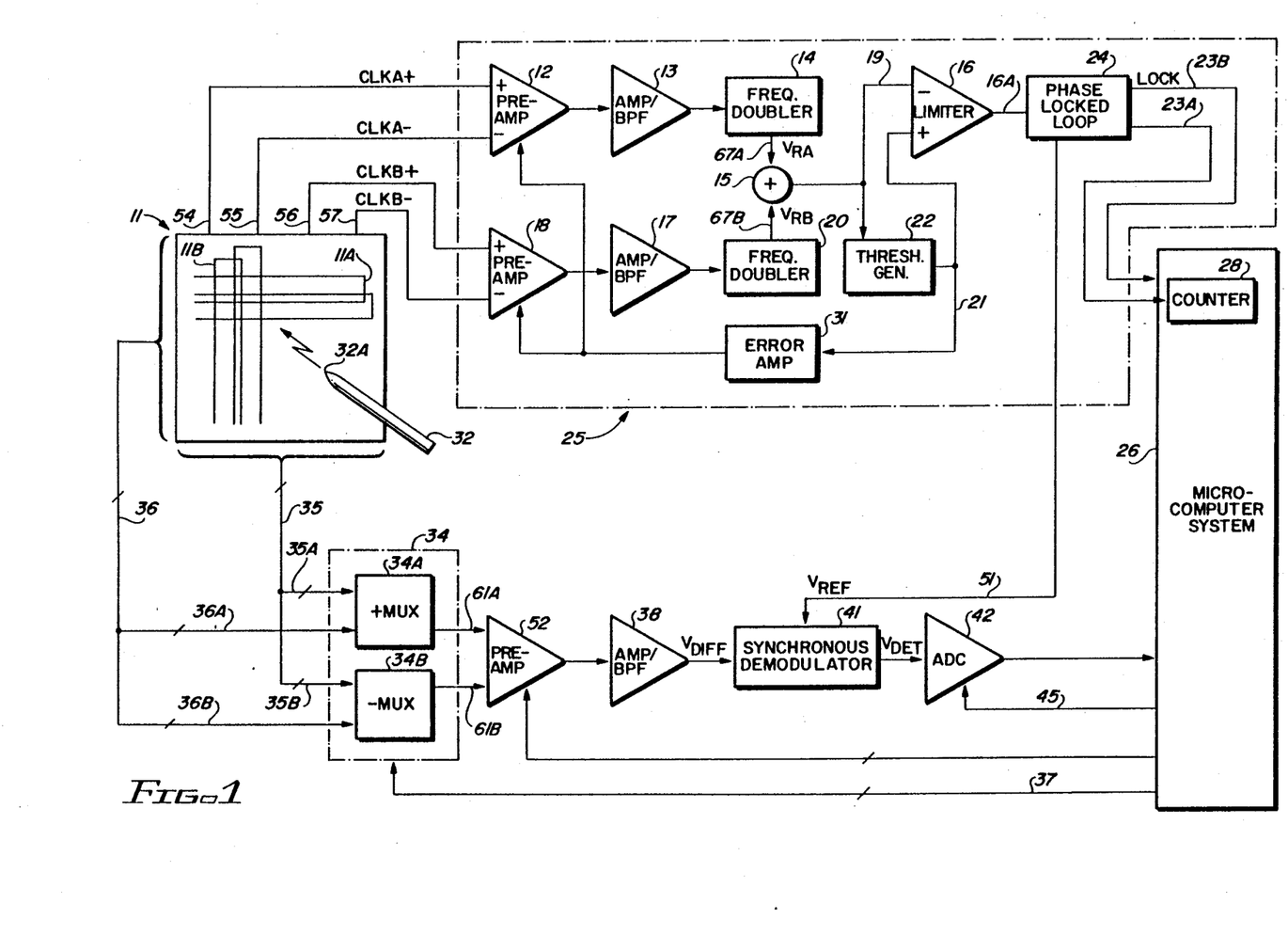
FIG. 1 is a block diagram of a presently preferred embodiment of the invention.

FIG. 1 shows a magnetic field coupled digitizing system wherein signals are induced onto conductors of a grid 11 by a magnetic signal transmitted by a cordless pointing device 32 (although a corded pointing device also could be used). Such grid conductor signals are processed by a data channel including multiplexor circuitry 34 that switches grid conductor signals on conductors 35 and 52 into a selectable gain preamplifier 52. The variable gain control is useful when the cursor needs to be positioned a significant distance above the tablet surface so that more gain is needed, or when various pointing devices having different signal levels are to be used (pointing devices having larger diameter inductors to radiate the magnetic signal generally have more signal strength). Having variable gain control also reduces the need for gain calibration or alignment. The data channel also includes amplification/bandpass filtering circuit 38 having an input connected to the output of preamplifier 36 and an output connected to synchronous demodulator 41. The output of synchronous demodulator 41 is fed to an analog-to-digital converter 42, whose implementation also performs post detection signal integration of the synchronous demodulator 41 output.

The multiplexing circuitry 34, in response to grid selection signals 37 produced by a microprocessor system 26, selectively connects the two inputs of preamplifier 36 to various differential coil conductor pairs, by means of various conductors collectively designated by numerals 35 and 36, causing the data channel to amplify and sample the grid signals. Microcontroller 26 controls the gain of the data channel by means of outputs that connect to the gain select inputs of preamplifier 36. Microprocessor system 26 also controls analog-to-digital converter 42 by signals on conductor 45. The digital output of analog-to-digital converter 42 is read by microcontroller system 26 to obtain a digital value of the amplitude and phase polarity of the sinusoidal signal that is presently sensed by the two presently selected grid conductors.

A carrier recovery circuit 25 includes two identical amplifier chains, the first including automatic gain controlled differential preamplifier 12 and amplification/bandpass filtering stage 13. The second amplifier chain includes an identical preamplifier 18 and an identical amplification/bandpass filtering stage 17. The + and − inputs of amplifier 12 are connected to carrier recovery conductors CLKA+ and CLKA−, respectively. The + and − inputs of amplifier 18 are connected to carrier recovery conductors CLKB+ and CLKB−, respectively. Carrier recovery circuit 25 includes a full-wave rectifier 14, which functions as a frequency doubler, connected to the output of amplifier 13. Carrier recovery circuit 25 also includes a full-wave rectifier 20, which functions as a frequency doubler, connected to the output of amplifier 17. (Preferably, full-wave rectifiers 14 and 20 are of the type that have essentially zero switching thresholds.) An OR circuit or signal combiner circuit 15 receives the double frequency signals from full-wave rectifiers 14 and 20. The output of signal combiner circuit 15 is connected to a comparator 26 that functions as a signal slicer and limiter. The output of comparator 26 is connected to the input of a phase-locked-loop circuit 24.

As subsequently explained with reference to FIGS. 2 and 2A, the pair of grid conductors CLKA+,CLKA- and the pair CLKB+,CLKB− each have an interleaved serpentine pattern that covers the entire active area onto grid 11. This configuration ensures that a carrier signal induced in grid 11 is present on at least one of those two pairs regardless of where pointing device 32 is positioned on the tablet surface.

A low-pass filter or threshold generator 22 filters the output of signal combiner 25 to a DC reference level on conductor 21. That DC reference level allows comparator circuit 16 to effectively extract a double frequency carrier reference signal from the output of signal combiner 15. The DC reference level also is used to control an AGC (automatic gain control) loop including an error amplifier 31 that varies the gain of the two preamplifiers 13 and 17 to regulate the signal levels into the two full-wave rectifiers for proper operation.

Figure 4A:
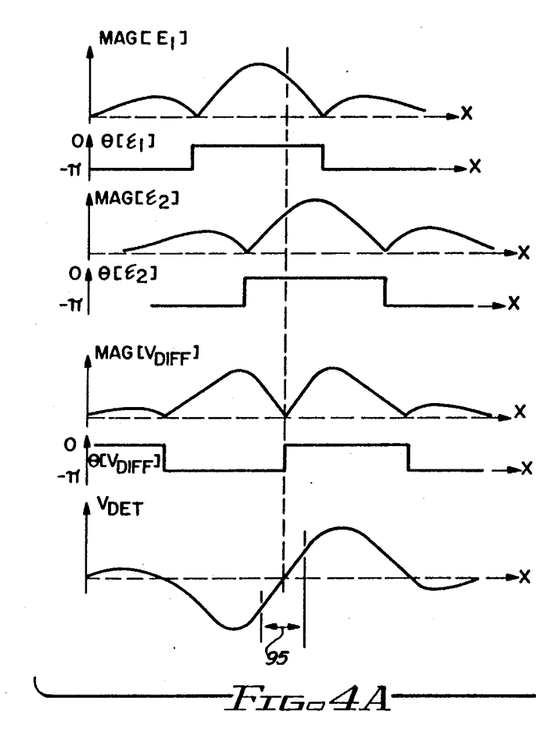
FIG. 4A contains graphs that show characteristics of the signals that are sensed by a differential coil element as a function of pointer position.

Phase-locked-loop 24 removes the jitter from the output signal produced by comparator 16 and generates a glitch-free square wave recovered reference carrier signal $V_{REF}$ on conductor 51 that is used by synchronous demodulator 41 to coherently recover both amplitude and phase polarity information from the sampled differential grid coil signals. The output signal $V_{DET}$ produced by data channel demodulator 41 is shown at the bottom of FIG. 4A, subsequently described, and represents the output of a "fine position" discriminator of the position of pointing device 32. That is, the amplitude of $V_{DET}$ is nearly proportional to the distance that pointing device 32 is from a particular location on the tablet surface and its polarity is positive or negative depending on whether the pointing device is on one side or the other side of that location.

Pointing device 32 has a number of control switches 80-1, 80-2, etc. (see FIG. 5) that can shift the frequency of the magnetic signal transmitted thereby. Each resulting shifted frequency represents a certain state of the pointing device switches/buttons or alternatively represents identifiers of the type of pointing device being used. In the latter case each pointing device has a frequency while in an idle state that is unique to that type of pointing device. Various pointing devices, such as cursors, pressure pens, writing pens, menu picking pens often require different "s" curve correction (i.e. correction of the $V_{DET}$ curve in FIG. 4A) because of different coil sizes and properties and different processing of position resolving data.

Pointing device 32 may also include circuitry that shifts the frequency of the transmitted signal in a continuous analog manner rather than in a digital discrete manner to represent the pressure on a tip of the pointing device. This capability of conveying the pressure on the tip of the pointing device to the tablet electronics is useful in "artist" applications where the user may want to vary the "width" of his brush strokes that is being recognized by the digitizer.

In order for the microcomputer system 26 to decode the meanings of the various shifted frequencies, it must first measure the frequency. This is performed by having output 23A of phase-locked-loop 24 clock a counter 28. To measure a frequency, microprocessor system 26 periodically reads the contents of counter 28 to ascertain the number of output pulses produced by phase-locked-loop 24 during a predetermined gating window. The number of counts is a measure of the frequency of the sampled grid signals. The measured frequency then can be correlated to the type of pointing device being used, the state of the control switches of the pointing device, or the pressure on the tip of the pointing device. Note that an alternative method is to feed an analog output of the phase-locked-loop 24 to analog-to-digital converter 42, although this technique adds to the scan time since the analog-to-digital converter is being time-shared.)

In the presently preferred embodiment of the invention, the carrier frequency of the magnetic signal transmitted by pointing device 32 is approximately 300 to 550 kilohertz, and is nominally 400 kilohertz. This frequency range was chosen because (1) it is below the standard AM radio band, yet is high enough that the power content of high harmonics of noise emitted by various common video monitors is significantly less than at lower frequencies, such as 10 to 100 kilohertz at which many prior digitizing systems operate, and (2) because the coupling efficiency between the pointing device and the grid conductors are increased at higher frequencies. The system of FIG. 1 has been designed to operate with a wide frequency range in order to allow use of a variety of types of pointing devices that each are individually identified by a characteristic frequency of the transmitted magnetic signal. Different types of pointing devices can perform different functions, such as decoding switches to produce discrete shifts in transmitted frequency, or producing continuously variable shifts in transmitted frequency to represent pressure, displacement, or the like measured by the pointing device.

Next, it will be convenient to describe the structure of the grid 11 in the tablet surface. FIG. 2 shows the grid conductor configuration of the x direction portion of grid 11, including the CLKA+, CLKA−, CLKB+, and CLKB− carrier recovery conductors and the position resolving conductors such as DAT0, DAT1, DAT2, etc. for resolving pointing device position in the x direction. Grid 11 consists entirely of "differential coil" elements that are organized into conductor pairs so that the tablet electronics can selectively sample and/or process the signals that have been induced on these coil elements by the magnetic signal transmitted by the pointing device. Each differential coil element will sense the signal radiated by the pointing device whenever the pointing device is close (in-proximity) to that differential coil element.

It should be noted here that for most digitizing applications another detection grid similar to this grid but orthogonally oriented thereto is also required for resolving a pointing device position in the y direction. In addition, depending upon the digitizer application and the area of the tablet writing surface, the number of conductors, conductor spacing, etc., can differ from what is illustrated in FIG. 2. However, the basic concepts of FIG. 2 that are used for rejecting interference, receiving a continuous carrier, and coarse position resolution are the same concepts that fundamentally define the layout of the actual detection grid.

Figures 2, 4:
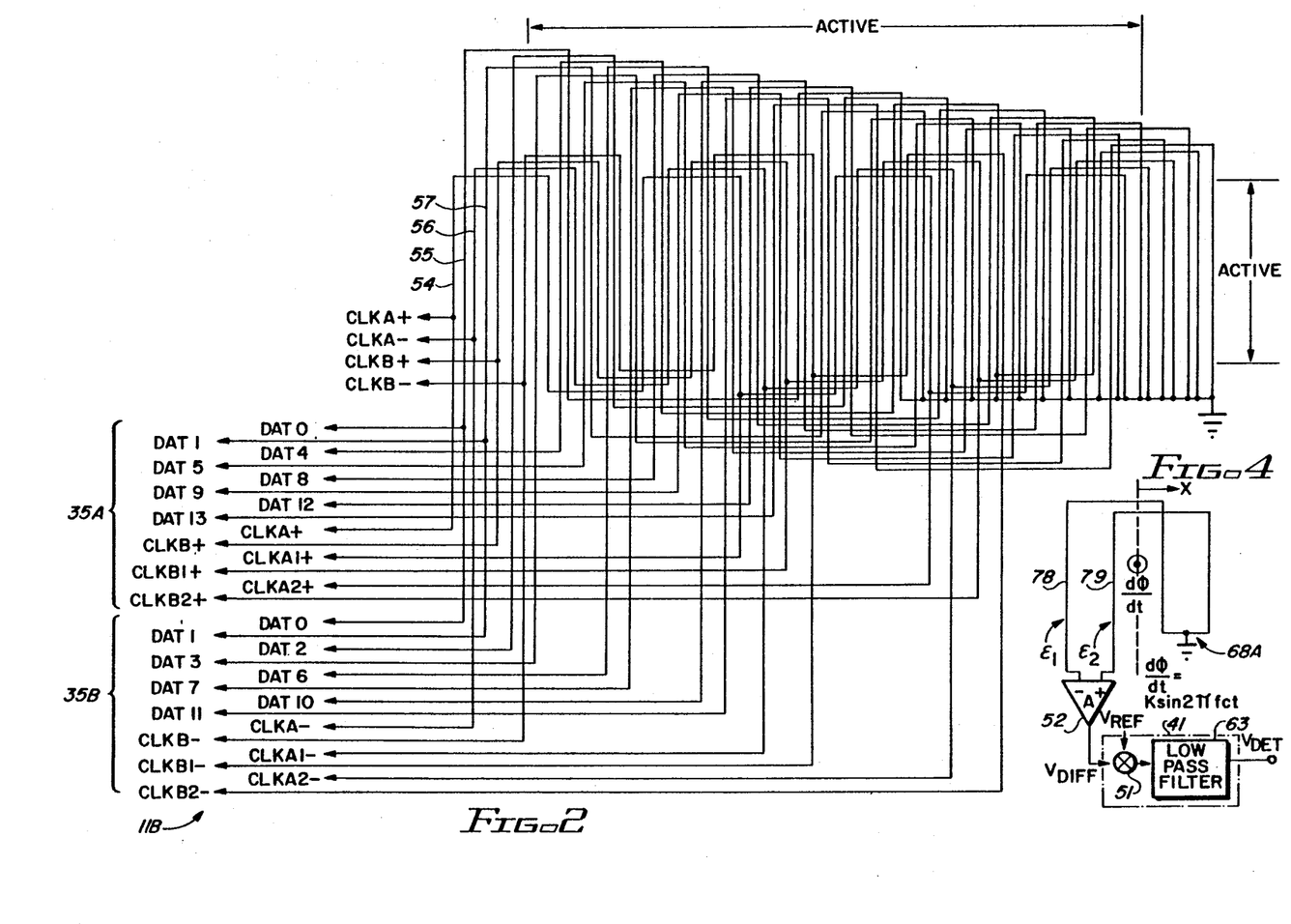
FIG. 2 is a diagram illustrating a basic detection grid for resolving pointing device position in the x direction and regenerating a carrier signal in accordance with the present invention.
FIG. 4 is a schematic diagram useful in describing the differential detection of signals induced by a pointer onto a differential coil element in the grid of FIG. 2.
Figure 2A:
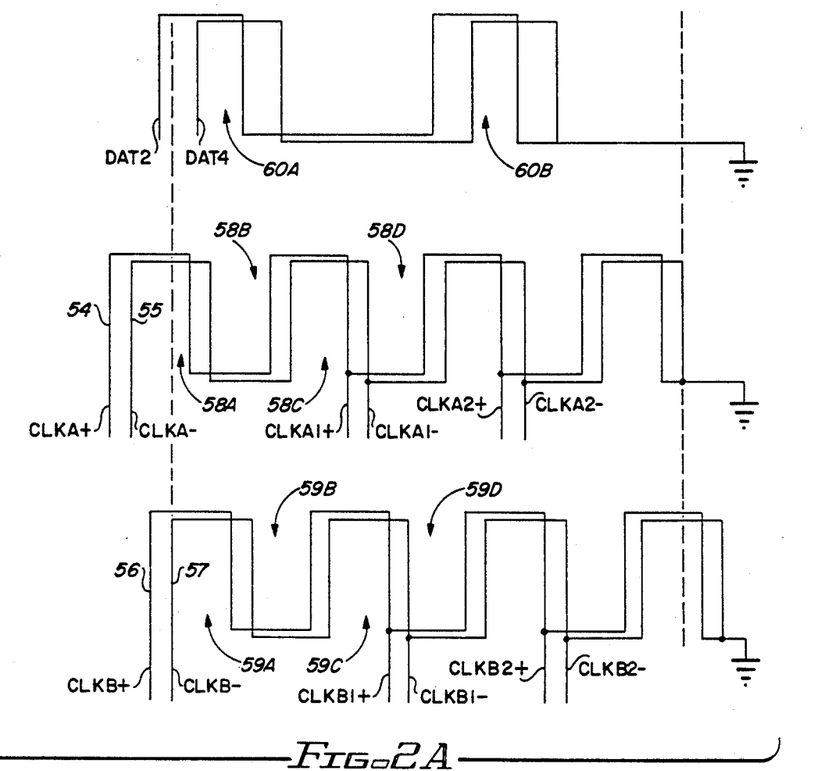
FIG. 2A is a diagram useful in explaining the structure of the grid shown in FIG. 2.

CLKA+ conductor 54 and CLKA− conductor 55 form a "carrier recovery conductor pair" that extends across the entire "active area" of grid 11 in the manner indicated in the center diagram of FIG. 2A. (FIG. 2A is an "exploded" view separately showing the two carrier recovery conductor pairs and the position resolving conductor pair DAT2,DAT4 of FIG. 2.) The spacing between the CLKA+ and CLKA− conductors shown in FIG. 2A is 0.25 inches in a presently preferred embodiment.

The carrier recovery conductor pair CLKA+,CLKA− defines seven "differential coil elements" such as 58A, 58B, 58C, etc., each having a U-shaped configuration. It should be appreciated that each differential coil element of a carrier conductor pair or a position resolving conductor can include either a single open ended U-shaped partial turn configuration, or a multiple closed turn configuration if it is desired to achieve a large signal induced by the transmitted magnetic signal. Similarly, as shown in FIG. 2A, the carrier recovery conductor pair CLKB+,CLKB− defines seven differential coil elements such as 59A, 59B, 59C, 59D, etc. The configuration of carrier recovery conductor pair CLKB+,CLKB− is identical to that of the pair CLKA+, CLKA−, except that the former is offset a certain amount as shown both in FIG. 2A and FIG. 2.

Figure 3:
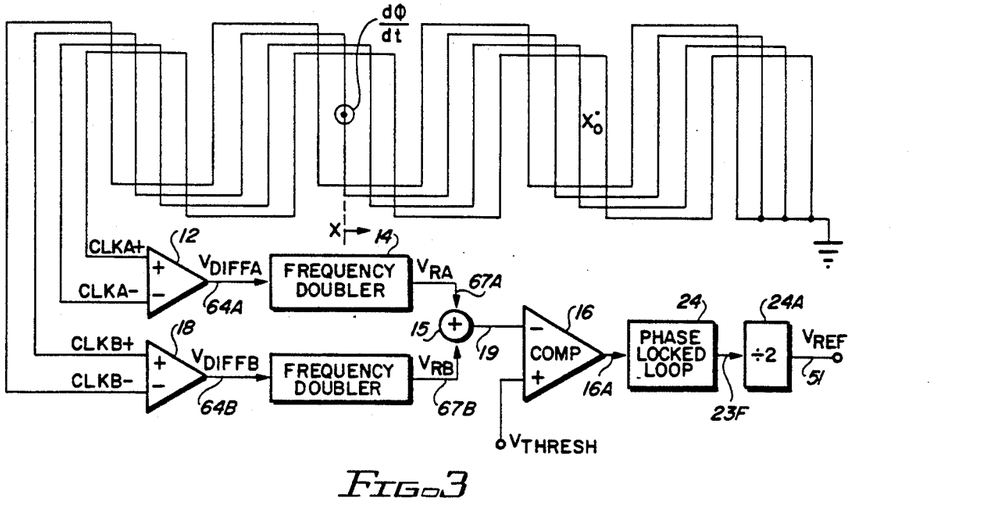
FIG. 3 is a diagram showing a portion of the grid of FIG. 2 and a portion of the circuitry of FIG. 1 used for regenerating the carrier signal.
Figure 3A:
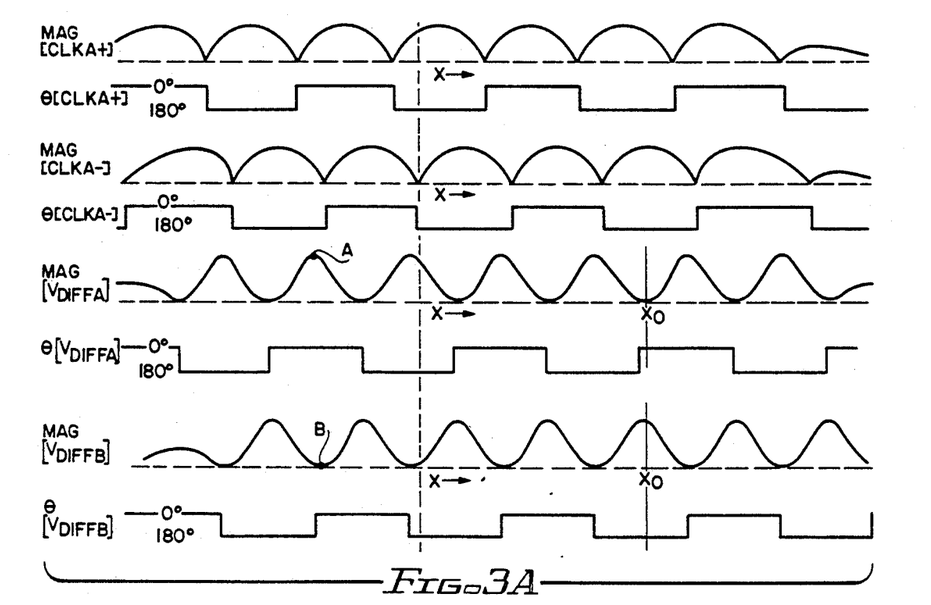
FIG. 3A is a diagram useful in describing signals induced onto the grid carrier recovery conductors of FIG. 2 as a function of pen position.

The amount of offset between the two carrier recovery conductor pairs is selected to produce the induced signal characteristics shown in the graphs of FIG. 3A, specifically MAG[$V_{DIFFA}$9 and MAG[$V_{DIFFB}$9, such that peak A of MAG[$V_{DIFFA}$] occurs at the same value of x as the null B occurs in the MAG[$D_{DIFFB}$]. In FIGS. 3 and 3A, x is the position along the x axis of the pointing device 32, and the various curves shown in FIG. 3A represent voltage magnitudes and phase angles of the sinusoidal voltages induced by the magnetic signal $d\phi/dt$ onto the various carrier recovery conductors as a function of pointing device position along the x axis. The grid structure shown in FIG. 2 includes an "active" area in which the "U-shaped coil section" of each conductor is on a single surface of a printed circuit board (or mylar grid), and the "wrap around" ends are provided on both sides of the edges of the printed circuit board, using feedthroughs, to prevent short-circuiting of the various conductors.

The configuration of the above-identified position resolving conductor pairs is shown in the top drawing of FIG. 2A, in which a position resolving conductor pair DAT2, DAT4 consists of two widely separated U-shaped differential coil elements 60A and 60B that are connected in series. The three sets of conductor pairs including the CLKA+, CLKA−, CLKB+, CLKB−, and DAT2, DAT4 conductors shown in FIG. 2A in the "exploded" view actually are superimposed and included in FIG. 2, along with numerous other similarly spaced position resolving conductor pairs. In FIG. 2, numeral 35A designates all of the "+" data conductors that feed into a "+" multiplexor section 34A of multiplexor 34. In FIG. 2, numerals 35A and 35B designate groups including both the carrier recovery conductors and the position resolving conductors, and also "taps" of the carrier recovery conductors. The taps are designated as CLKA1+, CLKA1−, CLKA2+, CLKA2-, CLKB1+, CLKB1−, CLKB2+, and CLKB2− in FIG. 2A. All of these conductors are connected to inputs of the "+" multiplexor section 34A and/or a "−" multiplexor section 34B component of multiplexor 34 of FIG. 1 to reduce the number of grid conductor signal inputs to be multiplexed into the input of preamplifier 36. The taps referred to are for "coarse" position resolving, in cases where the differential coil element sections are repeated to reduce the number of position resolving conductors needed.

It should be appreciated that when the tablet surface is large, a large number of differential coil elements are required in order to resolve the position of the pointing device. In these cases it is usually advantageous to organize the grid into conductor pairs having two or more differential coil elements connected in series as illustrated in FIG. 2A with position resolving conductor pair DAT2, DAT4 and differential coil elements 60A and 60B. The benefit of this organization is that it reduces the number of inputs that need to be multiplexed to the inputs of preamplifier 52. When multiple differential coil elements such as 60A and 60B are used an ambiguity exists in determining which of the series-connected differential coil elements is the one closest to pointing device 52. As subsequently explained, the differential signals at the above-mentioned tap points on the carrier conductor pairs can be measured and compared to resolve the ambiguity.

FIG. 3 shows a slightly simplified diagram of the carrier recovery circuitry 25 of FIG. 1 and its connection to the two carrier recovery conductor pairs in grid 11. Pointing device 32 by a radiates a sinusoidal local-ized changing magnetic flux signal $d\phi/dt = K*\sin(2\pi f_c t)$ through the tablet surface to induce sinusoidal voltages on conductors CLKA+, CLKA−, CLKB+, and CLKB−. The magnitude and the phase of these sinusoidal voltages relative to the excitation signal $d\phi/dt$ is presented in FIG. 3A as a function of the position of the pointing device in x direction. Also shown in FIG. 3A are magnitude and phase versus pointing device position plots of the sinusoidal voltages $V_{DIFFA}$ and $V_{DIFFB}$. The voltages $V_{DIFFA}$ and $V_{DIFFB}$ are the outputs of differential amplifiers 12 and 18, respectively. Note that the positions of the pointing device where the magnitude of $V_{DIFFA}$ is zero or nearly also the positions where the magnitude of $V_{DIFFB}$ zero or nearly zero. At other positions the magnitudes of $V_{DIFFA}$ and $V_{DIFFB}$ have intermediate non-zero values.

Figure 3B:
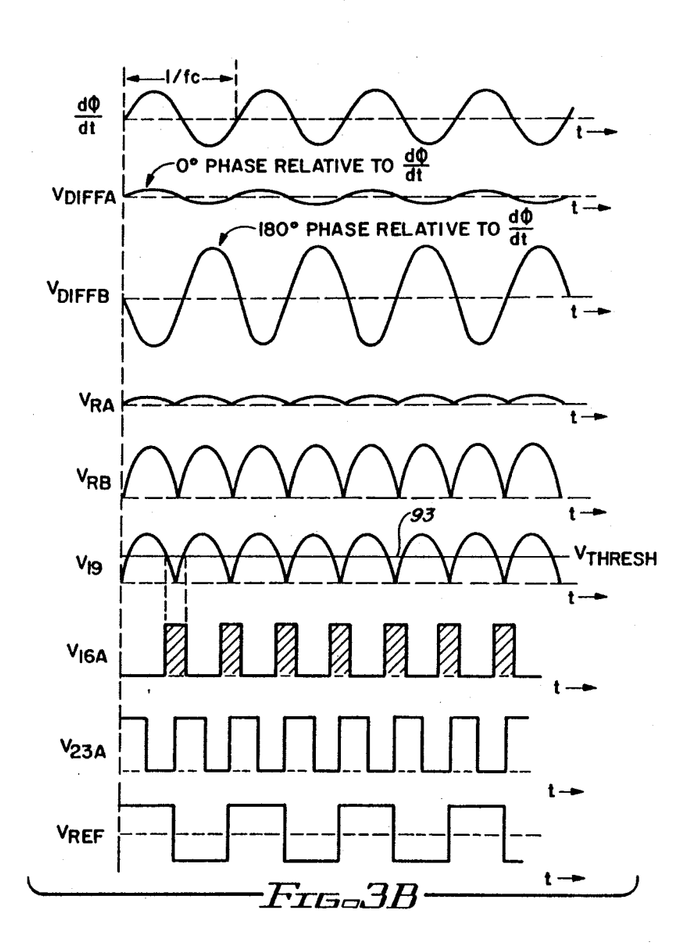
FIG. 3B is a diagram showing waveforms of signals produced by the carrier recovery circuitry shown in FIG. 3.

Referring now to FIG. 3B, the signal versus time waveforms shown here of the magnetic excitation signal $d\phi/dt$ and voltages $V_{DIFFA}$, $V_{DIFFB}$, etc., whose locations are identified in FIG. 3 are representative of those that would occur when pointing device 32 is located at reference position Xo in FIG. 3.

In this particular position note that $V_{DIFFA}$ is relatively weak and $V_{DIFFB}$ is opposite phase (180°) relative to $d\phi/dt$. At other pointing device position $V_{DIFFA}$ and $V_{DIFFB}$ may be in phase (0°) or opposite phase (180°) relative to $d\phi/dt$. Referring again to FIG. 3, the two frequency doubler circuits 14 and 20 produce the double frequency signal waveforms $V_{RA}$ and $V_{RB}$ in response to the $V_{DIFFA}$ and $V_{DIFFB}$ signal waveforms, respeotively. Signal combiner 15 simply outputs the larger of $V_{RA}$ and $V_{RB}$, which is $V_{RB}$ in this case, to produce waveform $V_{19}$ (FIG. 3B) on conductor 19.

Figure 5:
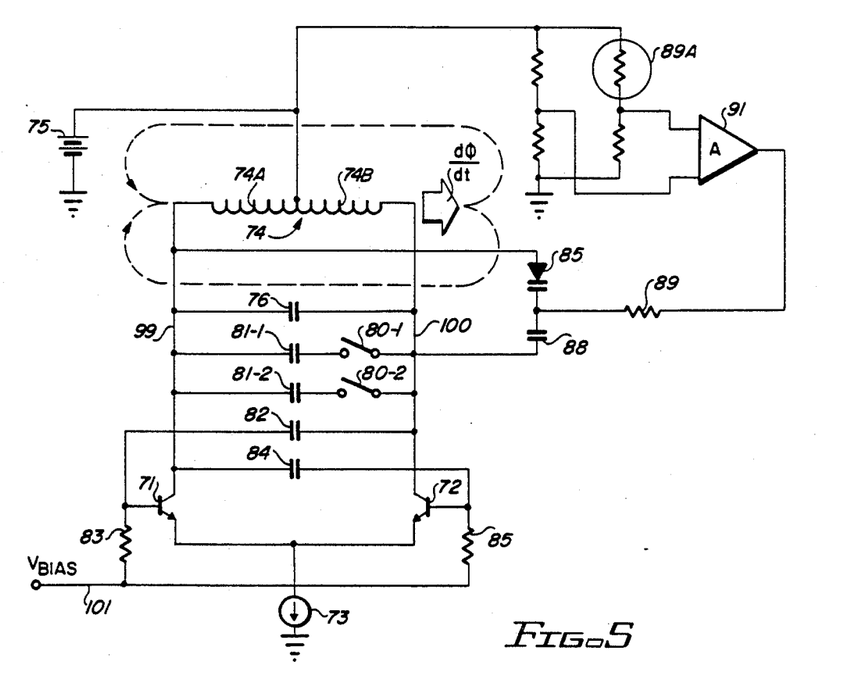
FIG. 5 is a schematic diagram of circuitry in the pointer shown in FIG. 1.

Threshold generator 22 of FIG. 1 low-pass filters the output of signal combiner 15 to produce the DC $V_{THRESH}$ signal indicated by line 93 in FIG. 5. The comparator 16 (which performs the function of the signal slicer/limiter block in FIG. 1) produces the signal 16A of FIG. 3B on conductor 16A of FIG. 3. The signal 16A has a frequency twice that of $d\phi/dt$.

Phase-locked-loop circuit 24 operates on comparator output 16A to produce the waveform 23A of FIG. 3B. The rising edge of each pulse of waveform 23A occurs in the center of each of the pulses of waveform 16A. This results in the recovered carrier signal $V_{REF}$ produced on conductor 51 by divide-by-two circuit 24A of FIG. 3 being precisely in phase or precisely 180° out of phase of with $d\phi/dt$, depending on which logical state divide-by-two circuit 24A assumes when initially powered up. This precise phase relationship is necessary for the proper operation of synchronous demodulator 41.

The circuitry in FIG. 4 aids in describing how signals on a position resolving conductor pair are processed to resolve the "fine" position of pointing device 32. In FIG. 3, $\epsilon_1$ and $\epsilon_2$ are the voltages induced on the two position resolving conductors 78 and 79, respectively, of a differential coil element such as 60A or 60B of FIG. 2A. $\epsilon_1$ and $\epsilon_2$ are applied (by multiplexor 34 of FIG. 1) to the inputs of differential amplifier 36. The voltage $V_{DIFF}$ is produced on the output of differential amplifier 52 and is applied to the input of synchronous demodulator circuit 41. Synchronous demodulator 41 includes a multiplier 62. Multiplier 62 has a second input which is a coherent reference $V_{REF}$ that is equivalent to the excitation signal $d\phi/dt$. Synchronous demodulator 41 also includes a low-pass filter circuit 63 connected to the output of the multiplier 62 to produce a detected voltage $V_{DET}$ which can be used to precisely resolve the position of pointing device 32 relative to grid 11.

Referring to FIG. 4A, the curve MAG[$\epsilon_1$] shows the magnitude of the induced sinusoidal voltage $\epsilon_1$ as the function of the relative position of pointing device 32 to the differential coil element 68A from which $\epsilon_1$ and $\epsilon_2$ are sensed. Similarly, MAG[$\epsilon_2$] represents the magnitude of the sinusoidal voltage $\epsilon_2$. The curves $\theta[\epsilon_1]$ and $\theta[\epsilon_2]$ represent the phase of $\epsilon_1$ and $\epsilon_2$ relative to the phase of $d\phi/dt$. The MAG[$V_{DIFF}$] curve shows the magnitude of the sinusoidal voltage $V_{DIFF}$ and $\theta V_{DIFF}$ represents the phase of the sinusoidal voltage $V_{DIFF}$ relative to the phase of $d\phi/dt$.

The function of synchronous demodulator 41 is to extract the amplitude and phase information present in the signal sensed by the differential coil element and put it into a form which can be used to precisely locate the position of the pointer 32 relative to the differential coil element being sensed. Synchronous demodulator 41 includes a multiplier circuit 51 that multiplies the differentially sensed signal $V_{DIFF}$ by a coherent carrier reference signal $V_{REF}$ and feeds the result to a low-pass filter 63. The output of low-pass filter 63 is the signal $V_{DET}$, which is shown at the bottom of FIG. 4A. The $V_{DET}$ curve in FIG. 4A includes a linear portion 95 that very precisely represents the distance of pointing device 32 from the reference position along the x axis designated by dotted line 97.

It should be noted here that the carrier regeneration process described previously and shown in FIGS. 3, 3A, and 3B, depending on the initial state of the divide-by-two circuit 24A in FIG. 3, can produce a reference signal $V_{REF}$ in FIG. 4 that is in phase (0°) or opposite phase (180°) relative to the excitation signal $d\phi/dt$. In the latter case the slope of the $V_{DET}$ versus position curve in the linear region 95 of FIG. 4A is negative instead of positive as illustrated. This ambiguity in the sign of the position resolver slope is easily resolved by sampling the $V_{DET}$ voltages for differential coil elements that are on each side of the differential coil element that is "fine position resolving" the location of the pointing device. The slope is positive/negative if the $V_{DET}$ voltage incrementally decreases/increases, respectively, for differential coil elements that are positioned incrementally further along in the positive x direction. Another variable that must be accounted for is that the slope of the $V_{DET}$ versus position curve is dependent on the strength of the excitation signal $d\phi/dt$. As performed in the prior art, this dependence is removed by dividing the value of $V_{DET}$ by another sampled voltage that is dependent on the strength of the excitation signal $d\phi/dt$.

Due to the relatively small number of differential coil elements forming a position resolving conductor pair, the electric and magnetic field coupling between adjacent conductors is relatively low in comparison to more complicated position resolving grid configurations. This results in a grid with a high self-resonance frequency which in turn allows the operating frequency to be raised from below 100 KHz to between 300 KHz and 550 KHz for improved pointing device power to detection grid signal strength conversion efficiency. For magnetic pointing device implementations, whether passive or active, the power dissipated by the pointing device is dependent on the peak flux $\phi$ radiated but is relatively independent of the rate of change of the radiated flux $d\phi/dt$. On the other, the signal induced onto the grid is a function of $d\phi/dt$ and not $\phi$. Raising the operating frequency improves conversion efficiency by allowing the peak flux $\phi$ to be lowered for a given $d\phi/dt$.

Pointing device 32 is actively powered with power from commonly available hearing aid or watch batteries. The circuits that are used in pointer 32 to create the signal transmitted from tip 32A contain a tuned circuit having a very high Q to minimize the power consumed for a given peak flux $\phi$ radiated. The tuned circuit in conjunction with a current switch active element form an LC oscillator. The current switch, in comparison to voltage saturating active element implementations, allows the "loaded" Q of the tuned circuit to closer approach the "unloaded" Q of the inductor L component of the tuned circuit for improved circuit efficiency. The current switch by injecting on it a "measured" amount of current into the tuned circuit stabilizes the level of oscillation and makes the radiated signal largely independent of variations in battery voltage. The "unloaded" Q of the inductor L is maximized by having its coil wound on a ferrite cylinder. The orientation of this cylinder is such that one end of the cylinder "points" to the writing surface of the tablet. The localized change in flux $d\phi/dt$ emanating from this "open gap" end of the ferrite inductor is the true excitation signal that induces voltages onto the conductors of the tablet detection grid.

Referring now to FIG. 5, a schematic diagram of the oscillator circuitry in pointing device 32 is shown. The circuit is powered by battery 75, which is connected to the center tap of inductor L. Capacitors 76, 81-1, 81-2 in conjunction with inductor L form a parallel LC tank circuit. Capacitors 82 and 84 couple the AC voltage across the parallel LC tank circuit to the differential inputs of a current switch formed by transistors 71 and 72. The current switch allows a "measured" current to alternately feed into opposite ends of the tank circuit. Constant current source 73 sets the amount of current that is injected into the tank circuit. Switches 80-1 and 80-2 when closed or alternately opened shift the operating frequency of the pointing device which the tablet electronics in turn decodes as a change in pointing device switch status. Additional switches and capacitors similar to 80-1, 80-2, 81-1, and 81-2 may be employed in the tuned circuit to convey the status of a more complicated pointing device having more switches.

An optional circuit consisting of 85, 88, 89, 91, and 89A may be connected to the tank circuit to allow the force that the pointing device tip is presenting to the tablet writing surface to be sensed and converted to a continuously variable shift in operating frequency which the tablet electronics in turn measures and converts to a force value. Device 89A is a pressure sensitive resistor pad that is placed between the opposite end of a shaft that the pointing device tip is on and a backstop that the body of the pointing device has to limit tip displacement. Whenever the tip is pressed against the tablet writing surface, this force is conveyed to the pressure sensitive resistor pad. This pad responds by lowering its resistance which amplifier 91 senses as a voltage change and converts to a larger DC voltage change on component 85. Device 85 is a voltage variable capacitor (varicap) whose capacitance value varies with the DC voltage applied across its two terminals. Thus, a force applied at the pointing device tip is converted to a capacitance change in the tank circuit, which in turn changes the operating frequency of the pointing device. (In a prior art cordless magnetic digitizer system, a different technique has been employed for conveying pointing device tip force information to the tablet. In this technique, the movement of a slug cylinder inside the coil of an inductor causes the inductance value of a tuned circuit to change. A spring in the tip of the pointing device converts the force on the tip into a displacement of the tip shaft which the slug cylinder is attached to. This prior art technique relative to the technique presented here has the disadvantage that it is actually displacement sensing and not force sensing and thus is more difficult for the user to modulate, for example, when he is trying to vary the width of his "brush strokes" being digitized.)

The basic circuit in FIG. 5 can be simplified while maintaining all the desirable features previously described by (1) removing capacitor 76 and reconnecting its terminals to the bases of transistors 71 and 73, respectively, and (2) replacing device 73 with a resistor. With a proper choice of capacitor values, capacitors 82, 76, 84 form a capacitor voltage divider which reduces the AC voltage at the base of transistor 71 and at the base of transistor 72 to a small value relative to the DC voltage at the same locations. Under these conditions, the current injected into the tank circuit remains "measured" and is controlled by the DC voltage ($V_{BIAS}$) at location 101, the base-emitter voltage drop of transistors 71 and 72 and the value of the resistor replacing device 73.

As described in U.S. Pat. No. 4,859,814, the noise radiated by video monitors generally is sufficiently uniform over a large area relative to the spacings between related grid conductors that equal amounts of noise are induced on the related conductors (conductor pair). Differential sensing of the signals on this conductor pair rejects the common mode interference created by the noise radiated by video monitors. The present invention adapts such differential sensing of the grid conductors to a magnetic field coupled cursor technology to maximize the signal-to-interference ratio.

The demodulated output of circuit 41 in FIG. 1 is sampled by a dual slope eleven bit analog-to-digital converter 42. The output of analog-to-digital converter 42 is then read by microcontroller system 26.

Phase-locked-loop circuit 24 acts as a narrow band filter to reduce the jitter component of the regenerated carrier reference. Phase-locked-loop circuit 24 produces a signal LOCK on conductor 23B and produces a signal of frequency 2F (where F is equal to the signal carrier frequency, and may represent control information, pointer tip pressure, etc.) on conductor 23A. Conductor 23A is connected to counter 28 in microprocessor control system 26.

Phase-locked-loop 24 has two bandwidths, one being a wide bandwidth of 40 KHz to effectuate rapid acquisition of the reference carrier signal and the other being a narrow bandwidth of 10 KHz to reduce jitter during the tracking of the reference carrier signal. Referring again to FIG. 3B, the phase-locked-loop employs a "sampling" type phase detector that provides an error signal whenever the positive going transitions of signal $V_{23A}$ are not at the center of the $V_{16A}$ pulses. This insures that the regenerated carrier signal $V_{REF}$ in FIG. 4 is either in phase (0°) or opposite phase (180°) relating to the signal input $V_{DIFF}$ to the synchronous demodulator. Reception of signals induced onto the carrier conductors is "fully differential" to effectuate elimination of common mode noise that otherwise degrades the recovery of a carrier reference. There is always a carrier signal present during the entire scan of grid conductors 11A and 11B for processing of button-actuated control information.

Information relating to the cordless pointing device type and the state of its switches is initiated and transmitted in parallel with pointer location information. This allows microcontroller system 26 to scan grid 11 in a shorter time when tracking and resolving the position of the pointing device.

The foregoing technique also allows implementation of a pressure-sensitive pointing device. Since the frequency of the pointing device can be measured independently of the scanning that is required for tracking and resolving the position of the pointing device, the interval in which the frequency measurement is made can be extended to as long as necessary for a fine resolution of the force-information transmitted by the pointing device in the form of a continuously variable shift in operating frequency.

Table 1 below indicates the attributes of some of the salient above-described features of the described embodiment of the invention.

TABLE I

| Parameter | Value | Attribute |
| --- | --- | --- |
| 1. Transfer method - pointing device signal to detection grid | Magnetic field induction onto differential coil elements | Rejects common mode electric field interference from sources such as CRT rasters, fluorescent lamps, LCD displays, hand movements, etc. Rejects broad area magnetic field interference from sources such as AM broadcast signals. The strength of the signal induced onto the grid is insensitive to grid conductor size - allows the use of ITO grid. |
| 2. Frequency of the pointing device signal | Between 300 KHz and 550 KHz | Eases the filtering requirements of the tablet electronics since the strongest interference components are outside this frequency range. Increases the strength of the signal induced onto the grid for a given pen power compared with lower frequencies. Combined effect - high noise immunity, low position reporting jitter. |
| 3. Pointing device signal generation | Actively powered High-Q, self-resonant LC Oscillator - inductor is in pen tip and radiates the magnetic signal | Very simple circuit implementation. Stable signal level. High conversion efficiency, i.e., strong radiated signal for given a pointing device power. Since the pointing device signal is |

TABLE I-continued

| Parameter | Value | Attribute |
|---|---|---|
| | | generated actively rather than passively by reradiation of an uplink signal from the grid, the strength of the signal induced onto the grid varies much less with how far the pointing device is above the tablet surface. The net result-high proximity, less power needed to operate tablet. |
| 4. Method of conveying pointing device type and switch button status to the tablet | Static frequency shift keying of the pointing device signal carrier | Very simple circuit implementation. Reliable indicator of pointing device status with negligible delay in encoding/decoding. |
| 5. Grid configuration | Individual differential coil elements for fine position resolution. Separate dual serpentine pattern for continuous carrier reference. Taps on same course position resolution. | High self resonance frequency - allows operation in the 300 KHz to 550 KHz frequency range. Since the grid is for reception only, the resistivity of the grid conductors is less critical - allows use of mylar grid. |
| 6. Grid signal processing - analog domain (part of the tablet electronics) | Differential amplification of all grid signals. Predetection bandpass filtering. Synchronous demodulation using regenerated carrier derived from the dual recovered carrier conductor signals and frequency doubler circuits, the signal combiner, the signal silicer, the PLL and the divide-by-two circuit. Post detection signal integration. | Fully utilizes the common mode interference rejection capabilities of the differential coil element grid configuration. Allows the time needed to sample each grid signal for a given level of interference suppression to be shortened. These shorter sample times plus the lack of wait times needed for "up link" excitation of the pointing device or separate "down link" transmission of cordless pointing device status allows a bandwidth and speed that is sufficient for the reproduction of handwriting. |

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

For example, single-ended, rather than differential, amplification of the signals induced onto the position resolving conductors and carrier recovery conductors can be used in some cases.

What is claimed is:

1. A digitizing system including a tablet and a cordless pointing device, comprising in combination:
    (a) a plurality of pairs of position resolving conductors each of which forms one or more differential coil elements in the tablet, receiving a magnetic signal transmitted by the pointing device;
    (b) first, second, third, and fourth carrier recovery conductors in the tablet receiving the magnetic signal;
    (c) position resolving circuitry including
        i. a differential amplifier,
        ii. multiplexing circuitry selectively coupling various pairs of the position resolving conductors to a pair of inputs of the differential amplifier,
        iii. synchronous demodulating circuitry coupled to an output of the differential amplifier, having a first input responsive to selected signals induced onto the differential coil elements and a second input responsive to a recovered pointing device carrier signal for producing position resolving information,
        iv. an analog-to-digital converter having an input coupled to an output of the synchronous demodulating circuitry to produce digital position resolving information;
    (d) a computerized control system having a plurality of inputs coupled to a plurality of outputs, respectively, of the analog-to-digital converter, and a plurality of outputs conductors coupled to selection inputs of the multiplexing circuitry;
    (e) carrier recovery circuitry including
        i. a first controllable gain differential amplifier having a pair of inputs coupled to the first and second carrier recovery conductors, respectively, and a second controllable gain differential amplifier having a pair of inputs coupled to the third and fourth carrier recovery conductors, respectively,
        ii. a first frequency doubler circuit having an input responsive to an output of the first controllable gain amplifier and a second frequency doubler circuit having an input responsive to an output of the second controllable gain amplifier,
        iii. signal combining circuitry having first and second inputs coupled to outputs of the first and second frequency doubler circuits, respectively,
        iv. a threshold generating circuit having an input coupled to the output of the signal combining circuit and an output coupled by an error amplifier circuit to gain control inputs of the first and second controllable gain amplifiers,
        v. a signal slicing, limiting circuit having a first input coupled to an output of the signal combining circuit and a second input coupled to an output of the threshold generating circuit,
        vi. a phase-locked-loop circuit having an input coupled to the output of the signal slicing, limiting circuit and producing a double frequency output signal,
        vii. a divide-by-two circuit having an input coupled to receive the double frequency output signal from the phase-locked-loop circuit to produce the recovered pointing device carrier signal; and (f) means in the computerized control system for measuring and decoding the frequency of the magnetic signal and resolving the position of the pointing device in response to the analog-to-digital converter.

2. The digitizing system of claim 1 wherein the magnetic signal has a frequency in the range of approximately 300 to 550 kilohertz.

3. The digitizing system of claim 1 wherein the differential amplifier is a controllable gain differential amplifier, the computerized control system being coupled to the differential amplifier and operating to control the gain thereof.

4. The digitizing system of claim 1 wherein the multiplexing circuitry includes a first section having a first group of inputs coupled to a first group of the position resolving conductors, and a second section having a second group of inputs coupled to a second group of the position resolving conductors.

5. The digitizing system of claim 4 wherein the threshold generating circuit is implemented by means of a low-pass filter and the signal slicing, limiting circuit is implemented by means of a comparator.

6. The digitizing system of claim 5 wherein the first and second frequency doubler circuits are implemented by means of full-wave rectifiers having essentially zero switching thresholds.

7. The digitizing system of claim 1 including means for performing post detection signal integration using the analog-to-digital converter.

8. The digitizing system of claim 1, wherein the plurality of pairs of position resolving conductors recited in Paragraphs (a) and (b) extend generally in a first direction along a surface of the tablets and further including another plurality of similarly arranged and connected pairs of position resolving conductors that extend along the surface of the tablet generally in a second direction orthogonal to the first direction, and a plurality of similarly arranged and connected carrier recovery conductors that extend along the surface of the tablet generally in the second direction.

9. The digitizing system of claim 1, wherein the decoding means recited in Paragraph (f) further includes means for identifying the type of the pointing device.

10. The digitizing system of claim 9, wherein the position resolving means recited in Paragraph (f) resolves the position of the pointing device in accordance with the type of the pointing device.

11. In a digitizing system including a tablet and a pointing device, a carrier recovery circuit comprising in combination:

(a) a first controllable gain amplifier having an input coupled to a first carrier recovery conductor in the tablet, respectively, and a second controllable gain amplifier having an input coupled to a second carrier recovery conductor in the tablet, respectively;

(b) a first frequency doubler circuit having an input responsive to an output of the first controllable gain amplifier and a second frequency doubler circuit having an input responsive to an output of the second controllable gain amplifier;

(c) signal combining circuitry having first and second inputs coupled to outputs of the first and second frequency doubler circuits respectively;

(d) a threshold generating circuit having an input coupled to the output of the signal combining circuit and an output coupled by an error amplifier circuit to gain control inputs of the first and second controllable gain amplifiers;

(e) a signal slicing, limiting circuit having a first input coupled to an output of the signal combining circuit and a second input coupled to an output of the threshold generating circuit; and (f) a phase-locked-loop circuit having an input coupled to the output of the comparator that is in a precise phase relationship to a carrier signal induced in the first and second carrier recovery conductors.

12. In a digitizing system, including a tablet and a pointing device, oscillator circuitry in the pointing device, comprising in combination:

(a) a power source having first and second terminals;

(b) an inductor having a center tap connected to a first terminal of the power source;

(c) first and second transistors, an emitter of the first transistor being coupled to an emitter of the second transistor and to a first terminal of a current source having a second terminal connected to the second terminal of the power source, a collector of the first transistor being coupled to a first terminal of the inductor, a collector of the second transistor being coupled to a second terminal of the inductor, a base of the first transistor being coupled by a first capacitor to the collector of the second transistor, a base of the second transistor being coupled by a second capacitor to the collector of the first transistor;

(d) a third capacitor coupled between the collectors of the first and second transistors; and (e) a bias voltage source coupled to the bases of the first and second transistors by first and second resistors, the inductor and the third capacitor forming a tank circuit, the current source producing a predetermined current, the first and second transistors forming a current switch that alternately switches the predetermined current into different parts of the tank circuit, whereby the power level of a magnetic signal transmitted from the inductor is substantially independent of the voltage of the power source and the inductor radiates maximum power at a self-resonant frequency of the tank circuit regardless of the capacitance coupled to the inductor.

13. In a digitizing system, the oscillator circuitry of claim 12 including a plurality of frequency shifting capacitors, each having a first terminal coupled to the collector of the first transistor and a second terminal coupled in response to a plurality of manual switches, respectively, to the collector of the second transistor.

14. In a digitizing system, the oscillator circuitry of claim 12 wherein the voltage of the power source, the inductance of the coil, the capacitance of the third capacitor, and the current supplied by the current source are such that neither of the first and second transistors saturate, whereby power loss of the oscillator circuitry is reduced so that the Q of the oscillator circuitry is increased.

15. In a digitizing system, the oscillator circuitry of claim 12 including a voltage variable capacitive device coupled between the first and second terminals of the inductor and means responsive to a transducer for controlling a voltage across the voltage variable capacitor in response to a signal produced by the transducer.

16. In a digitizing system including a tablet and a pointing device, an improvement in the pointing device comprising a self-resonant, current switched LC oscillator including:
  (a) an inductor and a capacitive element coupled to form a self-resonant tank circuit, wherein the inductor radiates a magnetic signal to the tablet;
  (b) current source means for supplying a measured amount of current; and
  (c) current switching means coupled to the current source means and the tank circuit for alternately switching the measured amount of current into different sections of the tank circuit,
whereby the inductor radiates maximum power at the self-resonant frequency of the oscillator regardless of the capacitance of the capacitive element.

17. In a digitizing system, the improvement of claim 16 including a voltage variable capacitive device coupled across the inductor, and means responsive to a transducer for controlling a voltage across the voltage variable capacitor in response to a signal produced by the transducer.

18. A digitizing system including a tablet and a cordless pointing device, comprising in combination:
  (a) a plurality of pairs of position resolving conductors each of which forms one or more differential coil elements in the tablet, receiving a magnetic signal transmitted by the pointing device;
  (b) first and second pairs of carrier recovery conductors each including at least one differential coil element;
  (c) synchronous demodulating circuitry having a first input responsive to selected signals induced onto the differential coil elements and a second input responsive to a recovered pointing device carrier signal 51 for producing position resolving information;
  (d) carrier recovery circuitry including
    i. a first controllable gain amplifier having a pair of inputs coupled to the first pair of carrier recovery conductors, respectively, and a second controllable gain amplifier having a pair of inputs coupled to the second pair of carrier recovery conductors,
    ii. a first frequency doubler circuit having an input responsive to an output of the first controllable gain amplifier and a second frequency doubler circuit having an input responsive to an output of the second controllable gain amplifier,
    iii. signal combining circuitry having first and second inputs coupled to outputs of the first and second frequency doubler circuits, respectively,
    iv. a threshold generating circuit having an input coupled to the output of the signal combining circuit and an output coupled by an automatic gain control circuit to gain control inputs of the first and second controllable gain amplifiers,
    v. a signal slicing circuit having a first input coupled to an output of the signal combining circuit and a second input coupled to an output of the threshold generating circuit,
    vi. a phase-locked-loop circuit having an input coupled to the output of the signal slicing circuit and producing a double frequency output signal;
    vii. a divide-by-two circuit having an input coupled to receive the double frequency output signal from the phase-locked-loop circuit to produce the recovered pointing device carrier signal; and
  (e) means for resolving the position of the pointing device in response to digital output signals produced by the analog-to-digital converter.

19. A method of operating the digitizing system including a tablet and a pointing device, comprising the steps of:
  (a) transmitting a magnetic signal from the pointing device to a plurality of pairs of position resolving conductors, each pair of position resolving conductors including one or more differential coil elements, and also transmitting the magnetic signal to first and second carrier recovery conductors in the tablet;
  (b) differentially amplifying selected signals induced onto the position resolving conductors;
  (c) applying the differentially amplified signals to a first input of a synchronous demodulating circuit having a second input responsive to a recovered pointing device carrier signal;
  (d) essentially simultaneously with steps (b) and (c), differentially amplifying signals induced by the magnetic signal onto the carrier recovery conductors;
  (e) doubling the frequency differentially amplified signals of Step (d);
  (f) operating a phase-locked-loop circuit in response to the combination of the frequency doubled signals to produce the regenerated pointing device carrier signal 51 which bears one or more precise phase relationships with the magnetic signal;
  (g) operating the synchronous demodulating circuitry in response to the differentially amplified signals of Step (b) and the regenerated pointing device carrier signal to produce position resolving information; and
  (h) operating on the information resolving position to produce a coordinate representing the location of the pointing device.

20. In a digitizing system including a tablet and a pointing device, a method of regenerating a carrier signal transmitted by the pointing device for use in the tablet, comprising the steps of:
  (a) transmitting a signal from the pointing device to first and second sets of carrier recovery conductors in the tablet;
  (b) amplifying signals induced onto the carrier recovery conductors by the carrier signal;
  (c) doubling the frequency of the amplified signals of Step (b);
  (d) operating a phase locked-loop-circuit in response to the frequency doubled signals to produce a regenerated pointing device carrier signal which has a precise phase relationship with the magnetic signal.

21. In a digitizing system including a tablet and a pointing device, a method of regenerating a carrier signal transmitted by the pointing device for use in the tablet, comprising the steps of:
  (a) transmitting a signal from the pointing device to first and second sets of carrier recovery conductors in the tablet;
  (b) amplifying signals induced onto the carrier recovery conductors by the carrier signal;
  (c) doubling the frequency of the amplified signals of Step (b); and
  (d) producing a regenerated pointing device carrier signal in response to the frequency doubled signals, which regenerated pointing device carrier signal has a precise relationship with the magnetic signal.

* * * * *